(12) United States Patent
Guo et al.

(10) Patent No.: US 10,950,804 B2
(45) Date of Patent: Mar. 16, 2021

(54) LIGHT-EMITTING LAYER AND PREPARATION METHOD, ORGANIC LIGHT EMITTING DIODE DEVICE AND DISPLAY APPARATUS

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Yuanhui Guo, Beijing (CN); Chun Wang, Beijing (CN); Hui Wang, Beijing (CN); Yisan Zhang, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 804 days.

(21) Appl. No.: 15/758,089

(22) PCT Filed: Jun. 26, 2015

(86) PCT No.: PCT/CN2015/082459
§ 371 (c)(1),
(2) Date: Mar. 7, 2018

(87) PCT Pub. No.: WO2016/101573
PCT Pub. Date: Jun. 30, 2016

(65) Prior Publication Data
US 2018/0261779 A1    Sep. 13, 2018

(30) Foreign Application Priority Data
Dec. 26, 2014  (CN) .......................... 201410828765.4

(51) Int. Cl.
| | | |
|---|---|---|
| *H01L 51/00* | (2006.01) | |
| *H01L 51/50* | (2006.01) | |
| *C09K 11/06* | (2006.01) | |

(52) U.S. Cl.
CPC .......... *H01L 51/0085* (2013.01); *C09K 11/06* (2013.01); *H01L 51/004* (2013.01);
(Continued)

(58) Field of Classification Search
CPC ................................................. H01L 51/0034
See application file for complete search history.

(56) References Cited

U.S. PATENT DOCUMENTS

2002/0041153 A1* 4/2002 Burrows ................ H05B 33/10
  313/512
2006/0110623 A1* 5/2006 Funahashi ............. C09B 23/148
  428/690
(Continued)

FOREIGN PATENT DOCUMENTS

| CN | 1498430 A |   | 5/2004 |
|---|---|---|---|
| CN | 1585578 A | * | 2/2005 |

(Continued)

OTHER PUBLICATIONS

CN1585578, Machine Translation. (Year: 2008).*
International Search Report dated Jun. 26, 2015, issued in counterpart International Application No. PCT/CN2015/082459 (14 pages).
Office Action dated Jun. 1, 2016, issued in counterpart Chinese Application No. 201410828765.4 (8 pages).

*Primary Examiner* — Robert A Vetere
(74) *Attorney, Agent, or Firm* — Westerman, Hattori, Daniels & Adrian, LLP

(57) ABSTRACT

A method for preparing a light-emitting layer, the light-emitting layer, an organic light emitting diode (OLED) device, and a display apparatus are provided. The light-emitting layer is prepared by preparing a host material containing a first photocrosslinker group and a guest material containing a second photocrosslinker group. The host (Continued)

material and the guest material are mixed in a solvent to form a mixture. The mixture is coated, annealed, and UV-irradiated on a substrate to form the light-emitting layer. As such, the disclosed light-emitting layer is prepared by the polymerization after being on the substrate. The light-emitting layer has a mesh structure. The mesh structure improves energy transfer between the host material and guest material and increases the lifespan of the resultant OLED device and OLED display apparatus.

10 Claims, 4 Drawing Sheets

(52) U.S. Cl.
CPC ...... *H01L 51/0039* (2013.01); *H01L 51/0042* (2013.01); *H01L 51/0043* (2013.01); *H01L 51/5016* (2013.01)

(56) References Cited

U.S. PATENT DOCUMENTS

| | | | | |
|---|---|---|---|---|
| 2008/0061686 | A1* | 3/2008 | Liu | H05B 33/14 313/506 |
| 2013/0112957 | A1* | 5/2013 | Adhikari | H05B 33/10 257/40 |
| 2013/0146852 | A1 | 6/2013 | Steudel et al. | |
| 2013/0299787 | A1 | 11/2013 | Steudel et al. | |

FOREIGN PATENT DOCUMENTS

| | | |
|---|---|---|
| CN | 1585578 A | 2/2005 |
| CN | 101405367 A | 4/2009 |
| CN | 101740724 A | 6/2010 |
| CN | 102516719 A | 6/2012 |
| CN | 102947962 A | 2/2013 |
| CN | 103180991 A | 6/2013 |
| CN | 104600203 A | 5/2015 |

* cited by examiner

| Cathode |
|---|
| Electron Transport Layer |
| Emitting Material Layer |
| Hole Transport Layer |
| Anode |
| Substrate |

LIGHT-EMITTING LAYER AND PREPARATION METHOD, ORGANIC LIGHT EMITTING DIODE DEVICE AND DISPLAY APPARATUS

CROSS-REFERENCES TO RELATED APPLICATIONS

This PCT patent application claims priority of Chinese Patent Application No. 201410828765.4, filed on Dec. 26, 2014, the entire content of which is incorporated by reference herein.

FIELD OF THE INVENTION

The present disclosure generally relates to the field of display technologies and, more particularly, relates to light-emitting layers and preparation method thereof, and corresponding organic light emitting diode (OLED) devices and display apparatus.

BACKGROUND

Currently, monitors for display include cathode ray tube, liquid crystal display (LCD), vacuum fluorescent device, plasma display, organic light emitting diode (OLED), field emission display, and electroluminescent display.

Compared with LCD, OLED as a flat panel display is thin and lightweight, and may have wide viewing angle, active light emitting, adjustable light color, low cost, fast response, low energy consumption, low driving voltage, wide operating temperature range, simple preparation process, high efficiency, and/or flexible display. The OLED technology has drawn great attention in industrial and scientific communities.

An OLED device often includes a functional layer and a light-emitting layer, which determine wavelength of the emitted light and also affect light-emitting efficiency and life span of the OLED device. Because a phosphorescent OLED device is able to use both the singlet and triplet excitons to enhance the external quantum efficiency of the OLED device, the phosphorescent OLED has been widely adopted in OLED devices.

The light-emitting layer of the phosphorescent OLED device includes a host material and a guest material. In existing technologies, the guest material is often a rare earth metal complex, and the host material is often an ordinary organic compound. Such host material and the guest material are prone to a phase separation. Lifespan of the OLED device is therefore shortened. However, the emerging of a polymer OLED device solves the above problems.

Methods for preparing high efficiency polymer OLED devices may focus on molecular structures and preparation processes. However, crosslinking with high degree may occur between the host material and guest material, and may reduce solubility of the materials. This may adversely affect formation of the light-emitting layer in the OLED devices.

BRIEF SUMMARY OF THE DISCLOSURE

One aspect of the present disclosure provides a method for forming a light-emitting layer. In the method, a host material containing a first photocrosslinker group is prepared. A guest material containing a second photocrosslinker group is prepared. The host material and the guest material are mixed in a solvent to form a mixture. The mixture is coated, annealed, and UV-irradiated on a substrate to form the light-emitting layer.

Optionally, the host material contains a plurality of first photocrosslinker groups.

Optionally, the first photocrosslinker group and the second photocrosslinker group are independently selected from methacrylamide, methacrloyl chloride, N-alkyl maleimide, β-dicarbonyl compounds, and a combination thereof.

Optionally, the host material is at least one of:

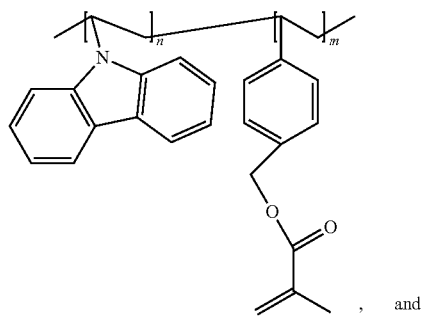

A1

, and

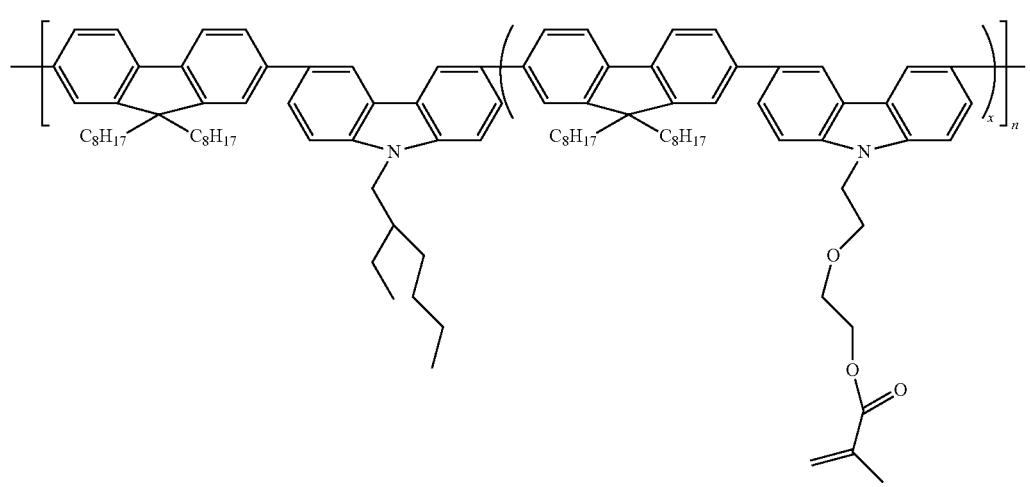

where x, n, and m are respectively an integer greater than 1, and the host material has a molecular weight between approximately 3000 and 100000.

Optionally, the guest material is prepared from a polycondensation of a rare earth metal complex as a hydroxyl group donor and the second photocrosslinker group. The rare earth metal is at least one of lanthanum, cerium, praseodymium, neodymium, promethium, samarium, europium, gadolinium, terbium, dysprosium, holmium, erbium, thulium, ytterbium, lutetium, scandium, and yttrium.

Optionally, the guest material is at least one of:

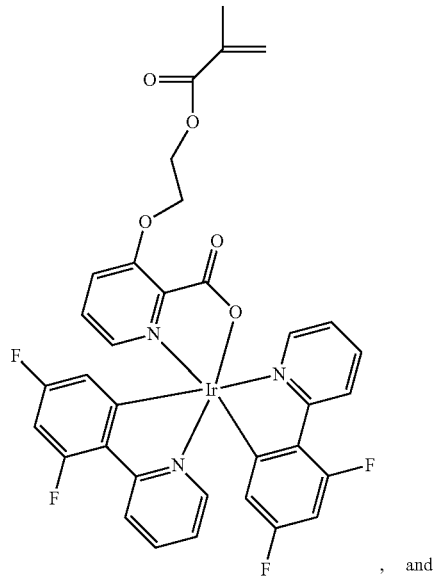

, and

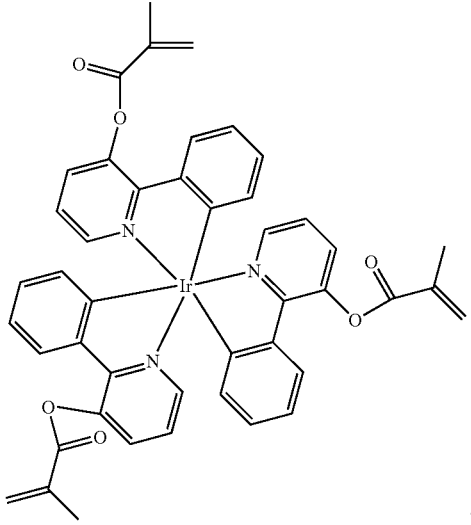

.

Optionally, the substrate is suitable for an organic light emitting diode (OLED) device. Optionally, after coating the mixture on the substrate and before the UV-irradiating, the coated mixture is annealed.

Optionally, a molar ratio of the host material to the guest material is approximately 100:2. Optionally, the UV-irradiating is performed for approximately 30 minutes.

Another aspect of the present disclosure provides a light-emitting layer prepared by the disclosed methods. The prepared light-emitting layer has a mesh structure.

Another aspect of the present disclosure provides an organic light emitting diode (OLED) device including the disclosed light-emitting layer. Another aspect of the present disclosure provides a display apparatus including the disclosed organic light emitting diode device.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

In order for those skilled in the art to better understand the technical solutions of the present invention, the followings together with accompanying drawings describe in detail the present invention with specific embodiments.

The present disclosure provides a light-emitting layer. The light-emitting layer is synthesized from a host material containing a plurality of first photoactive groups such as first photocrosslinker groups, and a guest material containing a second photoactive group such as a second photocrosslinker group. In one embodiment, the host material is a polymer host material.

Figure 1:
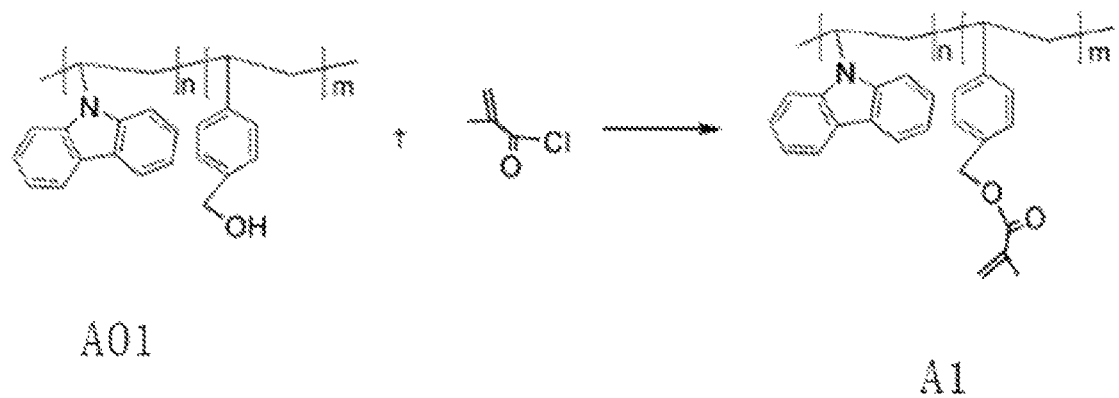
FIG. 1 illustrates an synthetic pathway for an exemplary host material according to various disclosed embodiments.

FIG. 1 illustrates a synthetic pathway for an exemplary host material according to various disclosed embodiments. Following the synthetic pathway shown in FIG. 1, a host material A1 is prepared.

For example, a nitrogen inlet, a stirrer, a heater, a condenser and a thermometer are configured on a flask, such as a 4-neck flask. At the beginning, toluene is used as a solvent and is added in the flask, and the nitrogen is introduced into the toluene solvent.

Next, a host material precursor A01 of the host material A1, containing hydroxyl repeating units, is added in the flask. Methacryloyl chloride is used as a photocrosslinker group and is added into the host material precursor A01 in the flask in a molar amount of about 2 times of the host material precursor A01.

In a dark environment, under the protection of nitrogen, at 60 degrees Celsius, after 3 hours of hydroxyl polycondensation (or condensation polymerization) reaction with the host material precursor A01, the photocrosslinker group is covalently attached to the host material precursor A01.

Upon completion of the hydroxyl polycondensation reaction, toluene is added. By stirring and washing, a polymer is precipitated. After centrifugal filtration, the host material A1 containing at least one repeating unit that contains at least one photocrosslinker group is obtained.

As shown in FIG. 1, in the structural formula of the host material A1, n and m are respectively an integer greater than 1. In one embodiment, the molecular weight of the host material A1 is between approximately 3000 and 100000, for example, between approximately 3000 and 5000, such as approximately 3000.

An infrared (IR) spectrum analysis is performed on the host material A1. The IR spectrum indicates an absorption peak at wavenumber 1722 $cm^{-1}$, which is known as the absorption peak of the ester carbonyl group. That is, the produced host material A1 contains ester carbonyl group.

Figure 2:
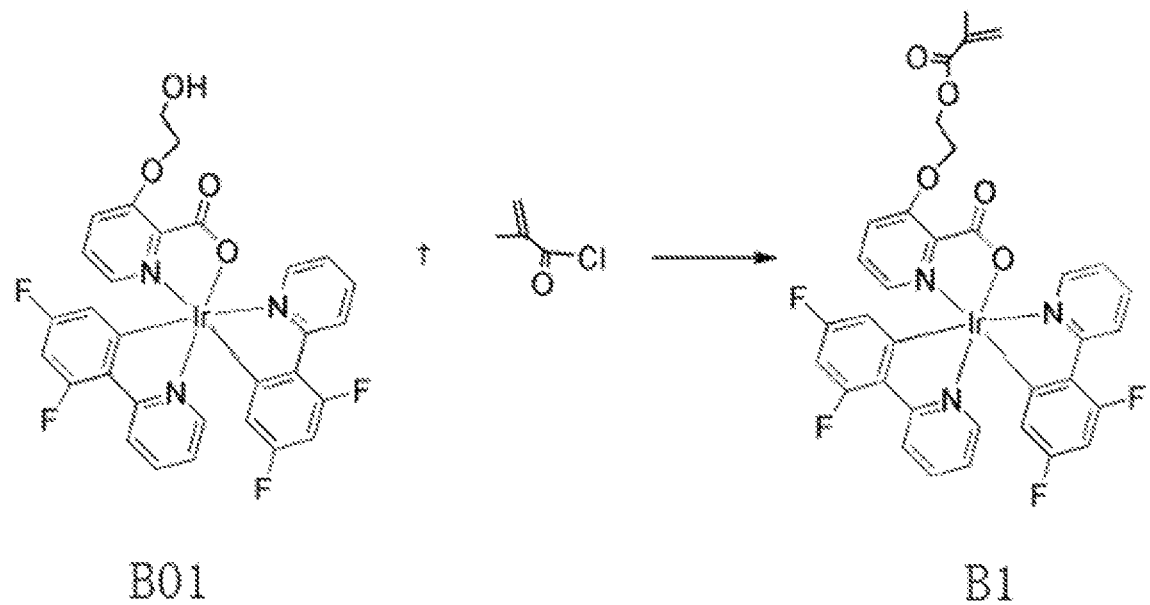
FIG. 2 illustrates an synthetic pathway for an exemplary guest material according to various disclosed embodiments.

Following the similar procedure illustrated in FIG. 1, a guest material B1 is prepared in the synthetic pathway illustrated in FIG. 2.

A nitrogen inlet, a stirrer, a heater, a condenser, and a thermometer are configured on a flask such as a 4-neck flask. At the beginning, toluene is used as a solvent and is added in the flask, and nitrogen is introduced into the toluene solvent.

Next, a guest material precursor B01 of the guest material B1, containing a hydroxyl group, is added in the flask. Methacryloyl chloride is used as a photocrosslinker group and is added into the guest material precursor B01 in the flask in a molar amount of about 2 times of the guest material precursor B01.

In dark environment, under the protection of nitrogen, at 60 degrees Celsius, after 3 hours of hydroxyl polycondensation with the guest material precursor B01, the photocrosslinker group is covalently attached to the guest material precursor B01 of the guest material.

Upon completion of the hydroxyl polycondensation reaction, toluene is added. By stirring and washing, a compound is precipitated. After centrifugal filtration, the guest material B1 containing the photocrosslinker group is obtained.

After the preparation of the host material A1 and the guest material B1, a light-emitting layer is prepared as follows.

At the beginning, the host material A1 and the guest material B1 are mixed and dissolved in a toluene solvent to form a mixture. A molar ratio of the host material A1 to the guest material B1 is about 100:2.

The mixture of the host material A1 and the guest material B1 is then spin-coated on a substrate; annealed at about 100 degrees Celsius for about 20 minutes, and irradiated under UV light for about 30 minutes to allow a complete polymerization of the host material A1 and the guest material B1 to produce AB1, which can be used as a light-emitting layer.

Figure 3:
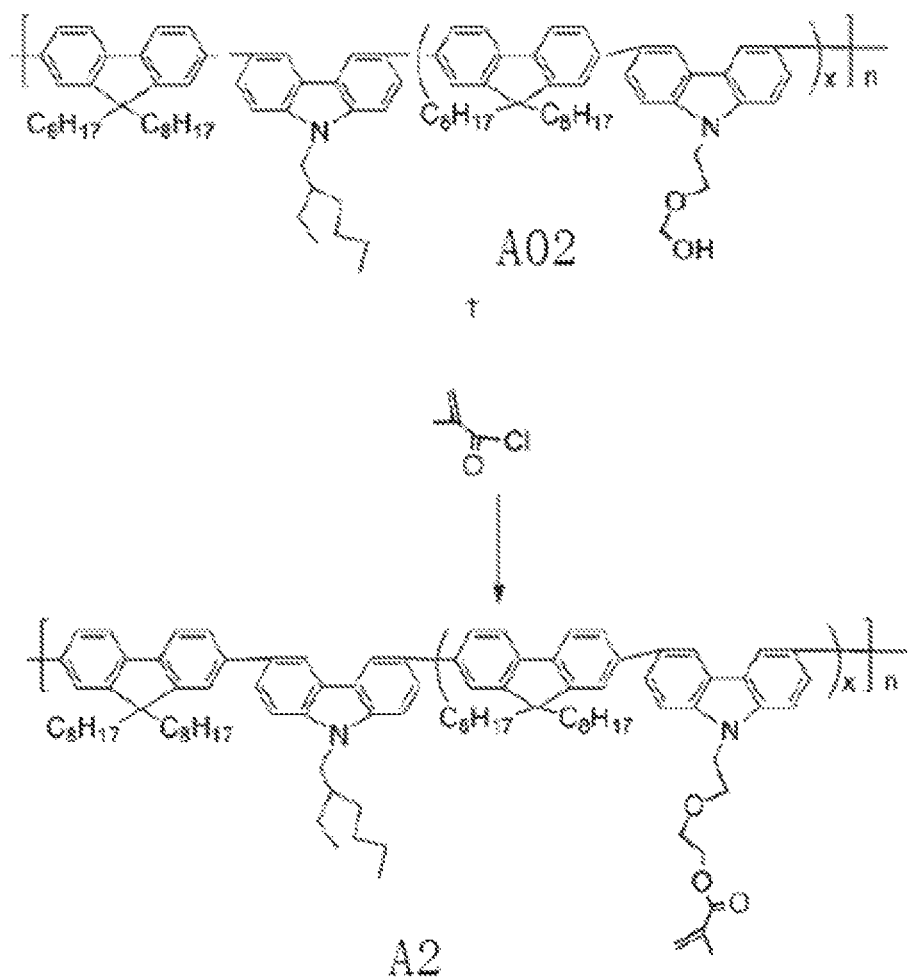
FIG. 3 illustrates an synthetic pathway for another exemplary host material according to various disclosed embodiments.

FIG. 3 illustrates a synthetic pathway for another exemplary host material according to various disclosed embodiments. Following the synthetic pathway shown in FIG. 3, a host material A2 is synthesized.

At the beginning, a nitrogen inlet, a stirrer, a heater, a condenser, and a thermometer are configured on a flask such as a 4-neck flask. The toluene is used as a solvent and is added in the flask, and nitrogen is introduced into the toluene solvent.

Next, a host material precursor A02 of the host material A2, containing hydroxyl repeating units, is added in flask. Methacryloyl chloride is used as a photocrosslinker group and is added into the host material precursor A02 in the flask in a molar amount of about 2 times of the host material precursor A01.

In a dark environment, under the protection of nitrogen, at about 60 degrees Celsius, after about 3 hours of hydroxyl polycondensation reaction with the host material precursor A02, the photocrosslinker group is covalently attached to the host material precursor A02.

Upon completion of the hydroxyl polycondensation reaction, toluene is added. By stirring and washing, a polymer is precipitated. After centrifugal filtration, the host material A2 containing at least one repeating unit of the photocrosslinker group is obtained.

As shown in FIG. 3, in the structural formula of the host material A2, n and x are respectively an integer greater than 1. The molecular weight of the host material A2 is between about 3000 and about 100000, such as about 100000.

An infrared (IR) spectrum analysis is performed on the host material A2. The IR spectrum indicates an absorption peak at wavenumber 1722 cm$^{-1}$, which is known as the absorption peak of ester carbonyl group. That is, the produced host material A2 contains ester carbonyl group.

Similar procedure is used to prepare a guest material B2. Following the specific synthetic pathway shown in FIG. 4, the guest material B2 is synthesized.

At the beginning, a nitrogen inlet, a stirrer, a heater, a condenser, and a thermometer are configured on a flask such as a 4-neck flask. Toluene is used as a solvent and is added in flask, and nitrogen is introduced into the toluene solvent.

Next, a guest material precursor B02 of the guest material B2, containing a hydroxyl group, is added in the flask. Methacryloyl chloride is used as a photocrosslinker group and is added into the guest material precursor B02 in the flask in a molar amount of about 2 times of the guest material precursor B02.

In dark environment, under the protection of nitrogen, at about 30-60 degrees Celsius, after 3 hours of hydroxyl polycondensation with the guest material precursor B02, the photocrosslinker group is covalently attached to the guest material precursor B02 of the guest material B2.

Upon completion of the hydroxyl polycondensation reaction, toluene is added. By stirring and washing, a compound is precipitated. After centrifugal filtration, the guest material B2 containing the photocrosslinker group is obtained.

After the preparation of the host material A2 and the guest material B2, another exemplary light-emitting layer may be prepared as follows.

At the beginning, the host material A2 and the guest material B2 are mixed and dissolved in a toluene solvent to form a mixture. A molar ratio of the host material A2 to the guest material B2 is about 100:2.

The mixture of the host material A2 and the guest material B2 is spin-coated on a substrate, annealed at about 100 degrees Celsius for about 20 minutes, and UV-irradiated for about 30 minutes to allow the host material A2 and the guest material B2 to be completely polymerized to produce AB2, which can be used as an exemplary light-emitting layer.

In various embodiments, the photocrosslinker group may be selected from methacrylamide, N-alkyl maleimide, β-dicarbonyl compounds, or combinations thereof. The photocrosslinker group can react with the hydroxyl group contained in the precursors of the host material and/or the guest material, and thus to be covalently attached to corresponding host material and/or guest material. The photocrosslinker groups attached on the host material and/or guest material may undergo polycondensation reaction under ultraviolet (UV) irradiation to produce a mesh structure to form the light-emitting layer. Thus, the guest material can be substantially, uniformly distributed in the host material.

Any suitable methods can be used in the present disclosure to attach photocrosslinker groups to the host material and/or the guest material, based on the structural characteristics of the photocrosslinker groups, the host material, and the guest material. In addition, any suitable crosslinking parameters can be used for the photocrosslinker groups in the present disclosure for the UV crosslinking process of the host material and guest material.

Figures 4, 5:
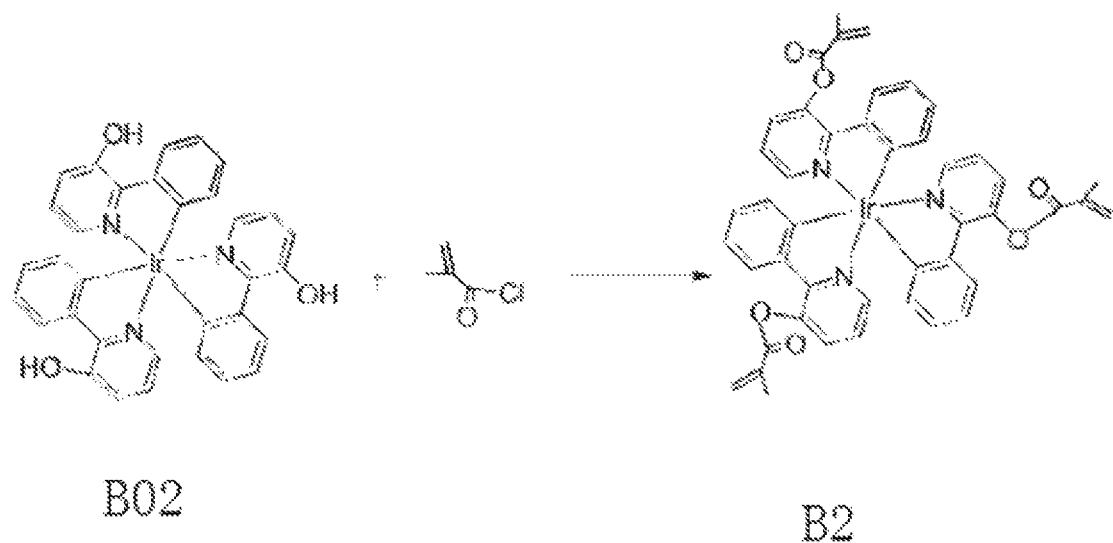
FIG. 4 illustrates an synthetic pathway for another exemplary guest material according to various disclosed embodiments.
FIG. 5 illustrates a schematic structure diagram of an exemplary organic light emitting diode device according to various disclosed embodiments.

The present disclosure also provides an organic light emitting diode (OLED) device. As shown in FIG. 5, the OLED device includes a substrate, an anode, a hole-transport layer, a light-emitting layer (EML), an electron transport layer, and a cathode. More layers may be included, and existing layers may be modified, omitted, or rearranged in the OLED device.

In an exemplary OLED device, the anode on the substrate may include an indium tin oxide (ITO) coated glass substrate. The hole-transport layer may include a poly(3,4-ethylenedioxythiophene):(polystyrene sulfonic acid) (PEDOT:PSS) film. The electron transport layer may include 1, 3, 5,-tris(N-phenylbenzimidazol-2-yl)benzene (TPBI). The cathode may include a two layer structure of CsF/Al. In various embodiments, the CsF layer may be interchangeable with any suitable fluoride of an alkali metal or an alkaline earth metal, such as LiF, CaF$_2$, and BaF$_2$. In one embodiment, the OLED device may be ITO/PEDOT:PSS (40 nm)/ EML (70 nm)/TPBI (30 nm)/CsF (1.5 nm)/Al (120 nm).

The light-emitting layer (EML) may have a mesh structure and may be prepared based on the host material A1 and the guest material B1 through the synthetic pathway illustrated in FIGS. 1-2.

The anode of the OLED device, the ITO coated glass substrate, may be prepared by an ultrasonic cleaning in acetone, detergent, deionized water and isopropanol. After cleaning, the substrate is dried in an oven.

The cleaned substrate is then treated with oxygen plasma to improve work function of the ITO and to further remove the organic contaminants remaining on the surface of the substrate to improve the surface contact angle of the substrate. Further, the substrate is spin-coated with PEDOT:PSS film to increase the Fermi energy level of the ITO to be between about −5.2 to about −5.3 eV. This greatly reduces the hole injection barrier from the anode.

After the spin-coated substrate is dried in a vacuum oven at about 80 degrees Celsius for about 8 hours, the substrate is moved into a nitrogen filled glove box for preparing the light-emitting layer. The host material A1 and the guest material B1 are mixed and dissolved in a toluene solvent to form a mixture having a molar ratio of the host material A1 and the guest material B1 of about 100:2.

After the mixture of the host material A1 and the guest material B1 for preparing the light-emitting layer is spin-coated on the substrate, annealed at about 100 degrees Celsius for about 20 minutes, UV irradiated for about 30 minutes, a complete polymerization of the host material A1 and the guest material B1 can be performed to produce an exemplary light-emitting layer (EML).

In one embodiment, under high vacuum environment of less than about 3×10$^{-4}$ Pa, a film of CsF (1.5 nm)/Al (120 nm) is deposited on the substrate as the cathode using thermal evaporation techniques.

As disclosed, the host material A1 and the guest material B1 are spin-coated first and then polymerized. Solubility reduction, occurred in conventional methods during a polymerization before the spin-coating, may be avoided.

Table 1 compares test results of the disclosed OLED devices and a conventional OLED device using a same light source for forming the light-emitting layer.

TABLE 1

|  | EML Lifespan (Hours) |
|---|---|
| Existing OLED device | 1000 |
| Exemplary OLED device (having AB1 as EML) | 1300 |
| Exemplary OLED device (having AB2 as EML) | 1500 |

As shown in Table 1, the lifespan of the disclosed OLED devices using the produced AB1 and AB2 as light-emitting layers is significantly improved, compared with conventional OLED device. In one embodiment, the disclosed OLED devices may have similar structures and preparation methods, for example, as illustrated in FIG. 5.

Figure 6:
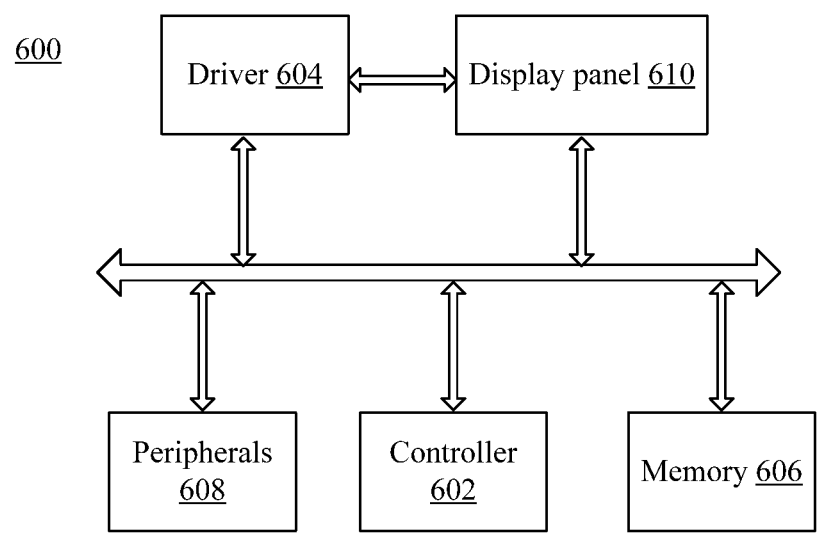
FIG. 6 illustrates a block diagram of an exemplary display apparatus according to the disclosed embodiments.

FIG. 6 illustrates an exemplary display apparatus 600 incorporating certain disclosed embodiments. The display apparatus 600 may be any appropriate device or component with certain display functions, such as an OLED panel, an OLED TV, a monitor, a cell phone or smartphone, a computer, a tablet, or a navigation system, or any products or components with OLED devices disclosed in the above embodiments. As shown in FIG. 6, the display apparatus 600 includes a controller 602, a driving circuit 604, memory 606, peripherals 608, and a display panel 610.

The controller 602 may include any appropriate processor or processors, such as a general-purpose microprocessor, digital signal processor, and/or graphic processor. Further, the controller 602 can include multiple cores for multi-thread or parallel processing. The memory 606 may include any appropriate memory modules, such as read-only memory (ROM), random access memory (RAM), flash memory modules, and erasable and rewritable memory, and other storage media such as CD-ROM, U-disk, and hard disk, etc. The memory 606 may store computer programs for implementing various processes, when executed by the controller 602.

Peripherals 608 may include any interface devices for providing various signal interfaces, such as USB, HDMI, VGA, DVI, etc. Further, peripherals 608 may include any input and output (I/O) devices, such as keyboard, mouse, and/or remote controller devices. Peripherals 608 may also include any appropriate communication module for establishing connections through wired or wireless communication networks.

The driving circuit 604 may include any appropriate driving circuits to drive the display panel 610. The display panel 610 may include any appropriate OLED devices disclosed in the above embodiments. During operation, the display 610 may be provided with image signals or other source data signals by the controller 602 and the driving circuit 604 for display.

The embodiments disclosed herein are exemplary only and not limiting the scope of this disclosure. Various alternations, modifications, or equivalents to the technical solutions of the disclosed embodiments can be obvious to those skilled in the art and can be included in this disclosure. Without departing from the spirit and scope of this invention, such other modifications, equivalents, or improvements to the disclosed embodiments are intended to be encompassed within the scope of the present disclosure.

What is claimed is:

1. A method for preparing a light-emitting layer, comprising:
preparing a host material containing a first photocrosslinker group;
preparing a guest material containing a second photocrosslinker group;
mixing the host material and the guest material in a solvent to form a mixture;
coating the mixture on a substrate; and
UV-irradiating the coated mixture of host material and the guest material to form the light-emitting layer,
wherein the host material is at least one of:

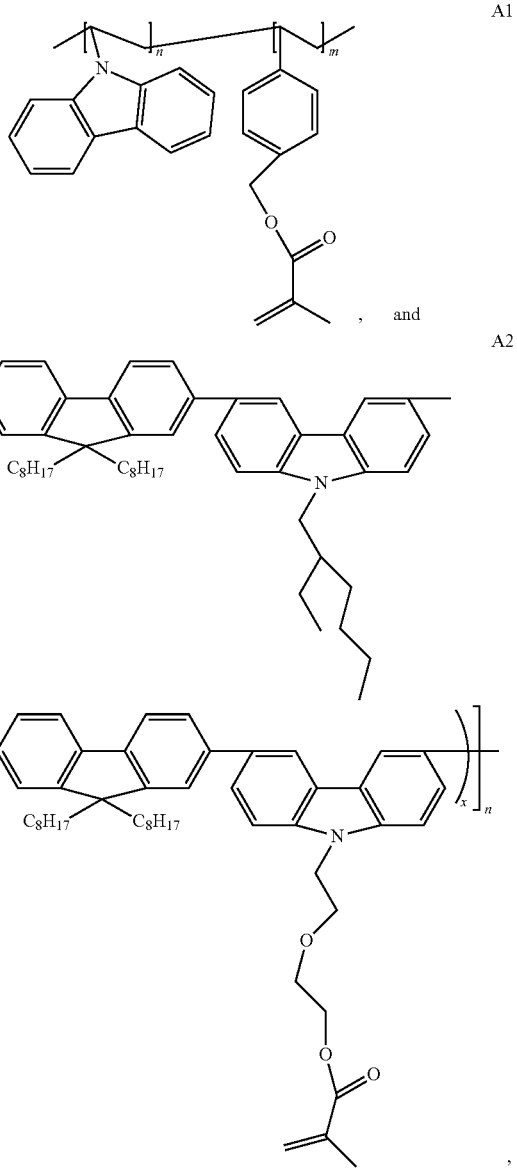

wherein x, n, and m are respectively an integer greater than 1, and the host material has a molecular weight between approximately 3000 and 100000.

2. The method according to claim 1, wherein:
the host material contains a plurality of first photocrosslinker groups.

3. The method according to claim 1, wherein:
the first photocrosslinker group and the second photocrosslinker group are independently selected from methacrylamide, methacrloyl chloride, N-alkyl maleimide, β-dicarbonyl compounds, and a combination thereof.

4. The method according to claim 1, wherein:
the guest material is prepared from a polycondensation of a rare earth metal complex as a hydroxyl group donor and the second photocrosslinker group.

5. The method according to claim 4, wherein:
the rare earth metal is at least one of lanthanum, cerium, praseodymium, neodymium, promethium, samarium, europium, gadolinium, terbium, dysprosium, holmium, erbium, thulium, ytterbium, lutetium, scandium, and yttrium.

6. The method according to claim 1, wherein the guest material is at leas one of:

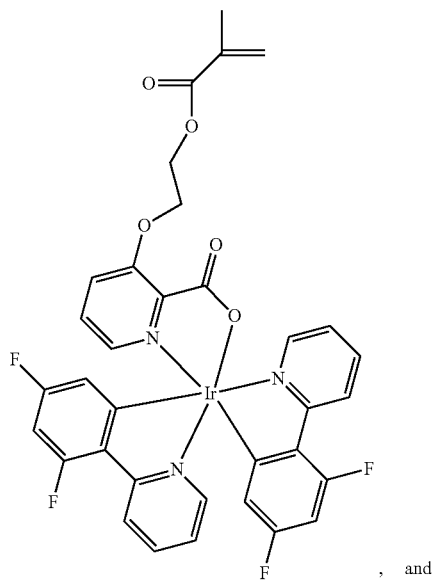

B1

, and

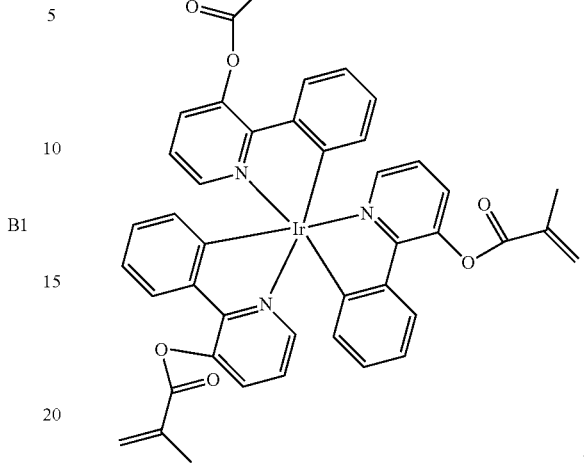

B2

7. The method according to claim 1, wherein the substrate is suitable for an organic light emitting diode (OLED) device.

8. The method according to claim 1, further including:
    annealing the coated mixture after coating the mixture on the substrate and before the UV-irradiating.

9. The method according to claim 1, wherein:
    a molar ratio of the polymer host material to the guest material is approximately 100:2.

10. The method according to claim 1, wherein:
    the UV-irradiating is performed for approximately 30 minutes.

* * * * *